(12) United States Patent
Chong et al.

(10) Patent No.: US 7,136,799 B2
(45) Date of Patent: Nov. 14, 2006

(54) MIXED SIGNAL DELAY LOCKED LOOP CHARACTERIZATION ENGINE

(75) Inventors: Kian Chong, Sunnyvale, CA (US); Dean Liu, Sunnyvale, CA (US); Claude R. Gauthier, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 671 days.

(21) Appl. No.: 10/394,789

(22) Filed: Mar. 21, 2003

(65) Prior Publication Data

US 2004/0183578 A1 Sep. 23, 2004

(51) Int. Cl.
*G06F 13/00* (2006.01)
*H03L 7/06* (2006.01)

(52) U.S. Cl. .............. 703/14; 703/2; 327/156; 716/6; 714/731

(58) Field of Classification Search .............. 703/2, 703/13, 14; 716/6; 327/156, 158, 147; 714/731
See application file for complete search history.

(56) References Cited

U.S. PATENT DOCUMENTS

| | | | | |
|---|---|---|---|---|
| 5,973,526 | A | * 10/1999 | Dabral | 327/170 |
| 6,037,812 | A | * 3/2000 | Gaudet | 327/116 |
| 6,388,480 | B1 | * 5/2002 | Stubbs et al. | 327/156 |
| 6,392,456 | B1 | * 5/2002 | Pyeon et al. | 327/156 |
| 2001/0049812 | A1 | * 12/2001 | Lutkemeyer | 716/6 |
| 2004/0232962 | A1 | * 11/2004 | Gomm et al. | 327/158 |

\* cited by examiner

*Primary Examiner*—Thai Phan
(74) *Attorney, Agent, or Firm*—Osha Liang LLP (57) ABSTRACT

A mixed signal delay locked loop characterization technique for automatically characterizing a mixed signal delay locked loop is provided. The technique tests the mixed signal delay locked loop using a top-down approach in order to ensure the robustness of the mixed signal delay locked loop. Top-level testing involves testing the performance of the mixed signal delay locked loop in different process corners, and the results obtained from the top-level testing are then used to test sub-components of the mixed signal delay locked loop.

17 Claims, 9 Drawing Sheets

MIXED SIGNAL DELAY LOCKED LOOP CHARACTERIZATION ENGINE

BACKGROUND OF INVENTION

Figure 1:
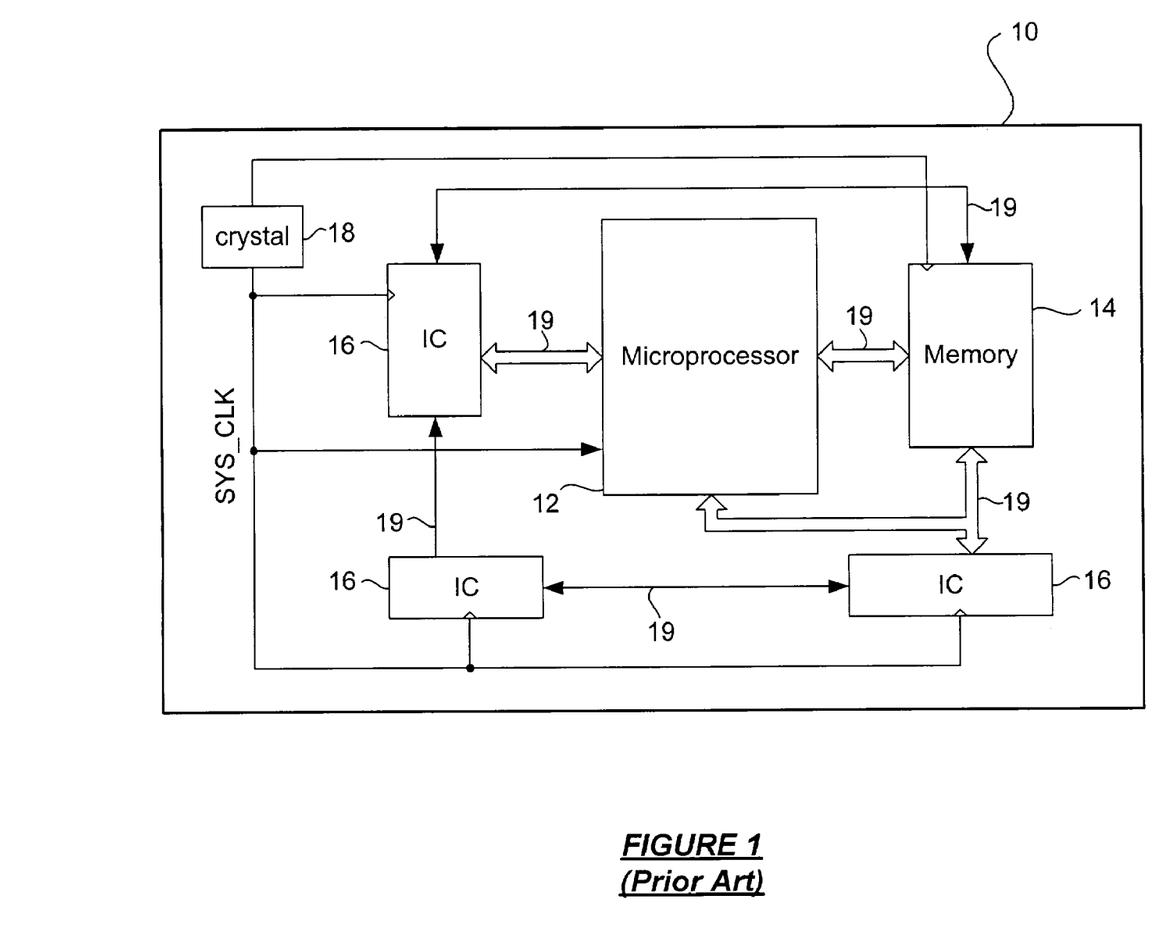
FIG. 1 shows a typical computer system.

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as SYS_CLK) to various parts of the computer system 10. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

Accordingly, as the frequencies of modern computers continue to increase, the need to rapidly transmit data between circuit interfaces also increases. To accurately receive data, a clock signal is often transmitted to help recover data transmitted to a receiving circuit by some transmitting circuit. The clock signal determines when the data should be sampled by the receiving circuit. In some cases, the clock signal may change state at the beginning of the time the data is valid. However, this is typically undesirable because the receiving circuit operates better when the clock signal is detected during the middle of the time the data is valid. In other cases, the clock signal may degrade as it propagates from its transmission point. Such degradation may result from process, voltage, and/or temperature variations that directly or indirectly affect the clock signal. To guard against the adverse effects of poor and inaccurate clock signal transmission, a delay locked loop ("DLL") is commonly used to generate a copy of the clock signal at a fixed phase shift with respect to the original clock signal.

Figure 2:
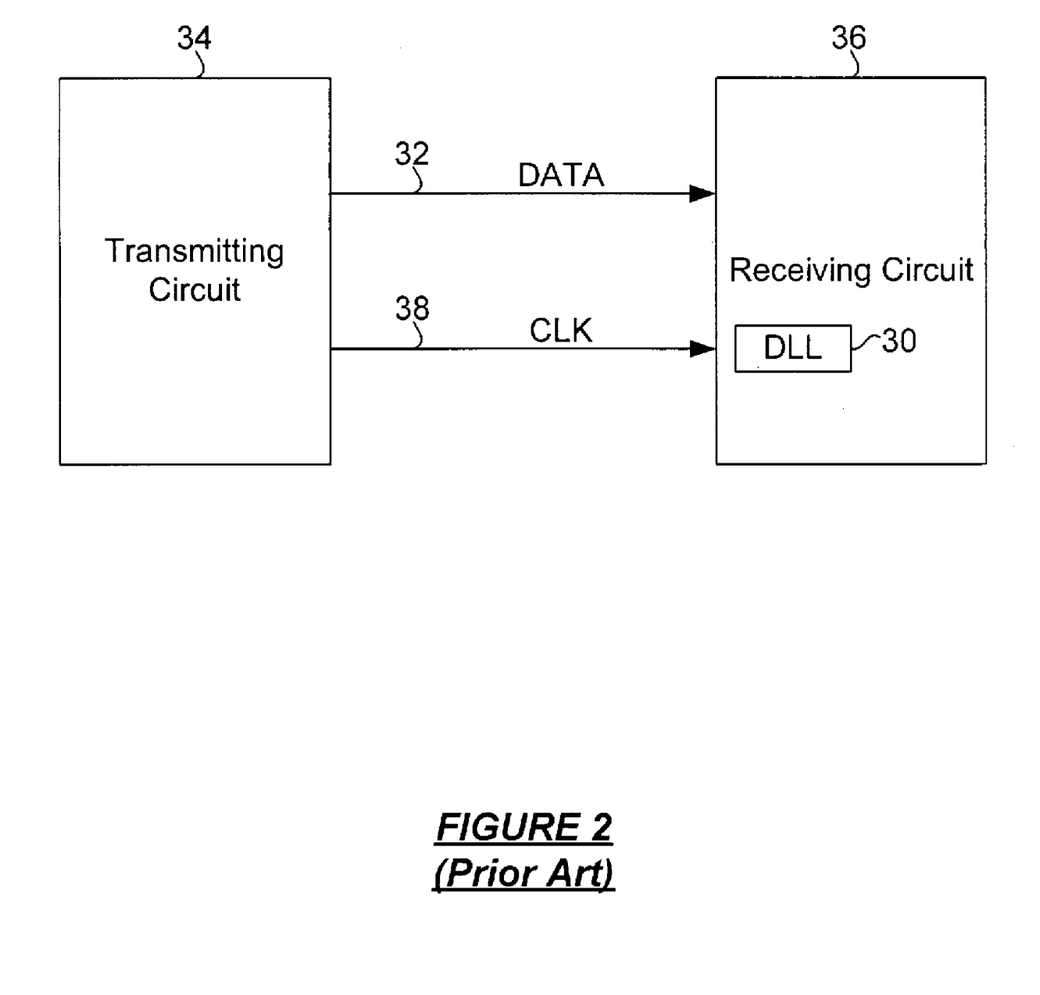
FIG. 2 shows a portion of a typical computer system in which a DLL is used.

FIG. 2 shows a portion of a typical computer system in which a DLL 30 is used. In FIG. 2, data 32 is transmitted from a transmitting circuit 34 to a receiving circuit 36. To aid in the recovery of the data 32 by the receiving circuit 36, a clock signal 38 is transmitted along with the data 32. To ensure that the data 32 is properly latched by the receiving circuit 36, the DLL 30 (which in FIG. 2 is shown as being part of the receiving circuit 36) regenerates the clock signal 38 to a valid voltage level and creates a phase shifted version of the clock signal 38. Accordingly, the use of the DLL 30 in this fashion ensures (1) that the data 32 is properly latched by triggering the receiving circuit 36 at a point in time in which the data 32 is valid and (2) that the clock signal 38 is buffered by the receiving circuit 36.

Figure 3:
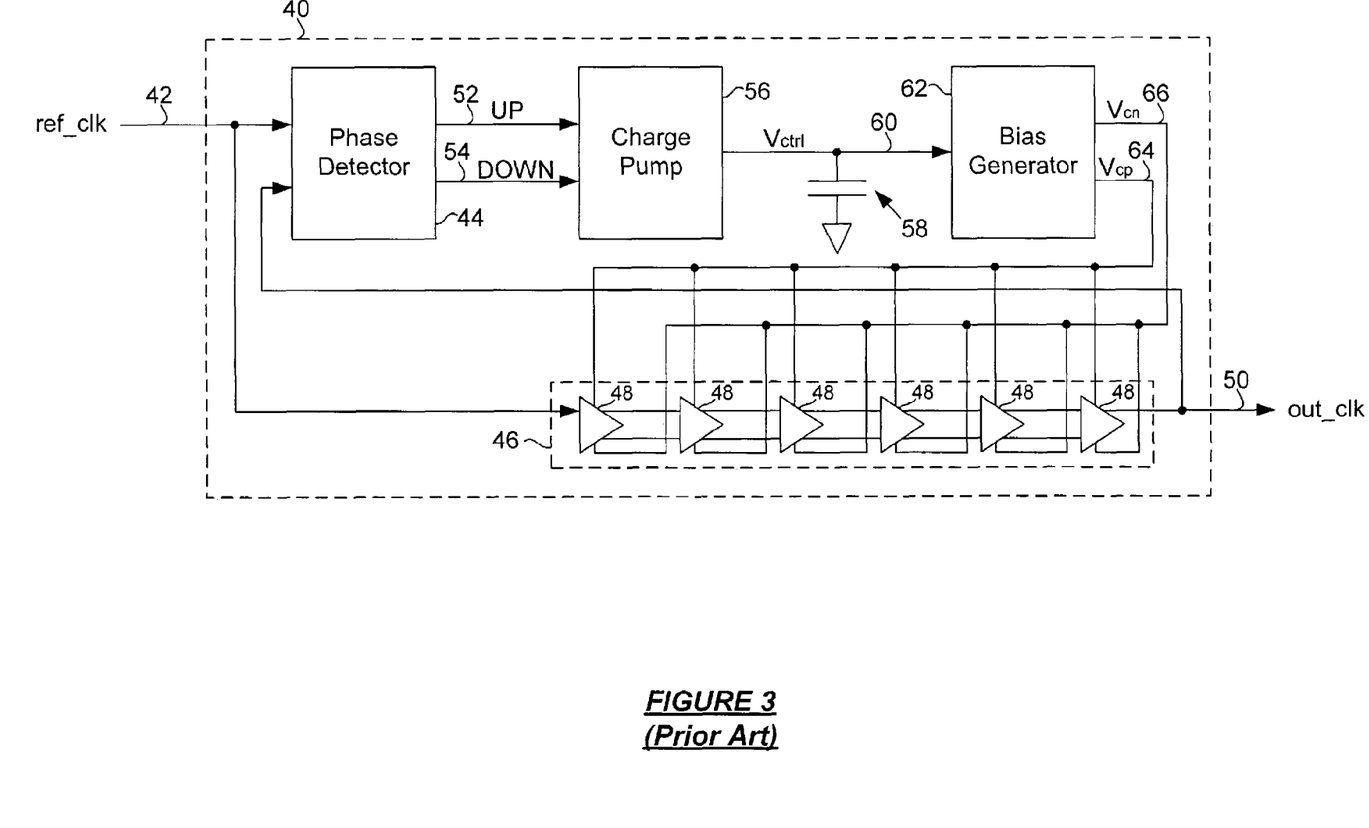
FIG. 3 shows a typical DLL.

FIG. 3 shows a typical DLL 40. A reference clock signal, ref_clk 42, serves as an input to a phase detector 44 and a voltage-controlled delay line 46 that has a plurality of delay elements 48. An output clock signal, out_clk 50, from the voltage-controlled delay line 46 serves as an output of the DLL 40 and as a second input to the phase detector 44. The phase detector 44 compares the phase offsets between the reference clock 42 and the output clock 50 and, in turn, generates pulses on UP and DOWN signals 52 and 54 to a charge pump 56. Depending on the UP and DOWN signals 52 and 54, the charge pump 56 adds or removes charge from a filter capacitor 58 using a control voltage signal Vctrl 60. The control voltage signal 60 is then used by a bias generator 62 to produce bias voltages Vcp and Vcn 64 and 66 that control the delay of the delay elements 48 in the voltage-controlled delay line 46. Thus, the DLL 40 is used to maintain a fixed phase relationship between its input clock signal and its output clock signal.

As mentioned above, as the need for and proliferation of DLLs continues to increase with increasing processor speeds, DLL accuracy and functionality is becoming a significant and important concern for circuit designers and the like.

SUMMARY OF INVENTION

According to one aspect of one or more embodiments of the present invention, a method for characterizing a mixed signal delay locked loop comprises top-level testing the mixed signal delay locked loop to generate a waveform representative of an operation of the mixed signal delay locked loop, bottom-level testing at least one of the digital sub-circuits in the mixed signal delay locked loop, and bottom-level testing at least one of the analog sub-circuits in the mixed signal delay locked loop.

According to one aspect of one or more embodiments of the present invention, a computer-readable medium having recorded therein instructions executable by processing comprises instructions for: top-level testing a mixed signal delay locked loop to generate a waveform representative of an operation of the mixed signal delay locked loop; bottom-level testing at least one of the digital sub-circuits in the mixed signal delay locked loop; and bottom-level testing at least one of the analog sub-circuits in the mixed signal delay locked loop.

According to one aspect of one or more embodiments of the present invention, a computer system comprises a processor, a memory, and instructions, residing in the memory and executable by the processor, for: top-level testing a mixed signal delay locked loop to generate a waveform representative of an operation of the mixed signal delay locked loop, bottom-level testing at least one of the digital sub-circuits in the mixed signal delay locked loop, and bottom-level testing at least one of the analog sub-circuits in the mixed signal delay locked loop.

According to one aspect of one or more embodiments of the present invention, a method for characterizing a mixed signal delay locked, loop comprises step for top-level testing the mixed signal delay locked loop to generate a waveform representative of an operation of the mixed signal delay locked loop, step for bottom-level testing at least one of the digital sub-circuits in the mixed signal delay locked loop, and step for bottom-level testing at least one of the analog sub-circuits in the mixed signal delay locked loop.

Other aspects and advantages of the invention will be apparent from the following description and the appended claims.

BRIEF DESCRIPTION OF DRAWINGS

FIG. 7 shows a flow process in accordance with an embodiment of the present invention.

DETAILED DESCRIPTION

Figure 4:
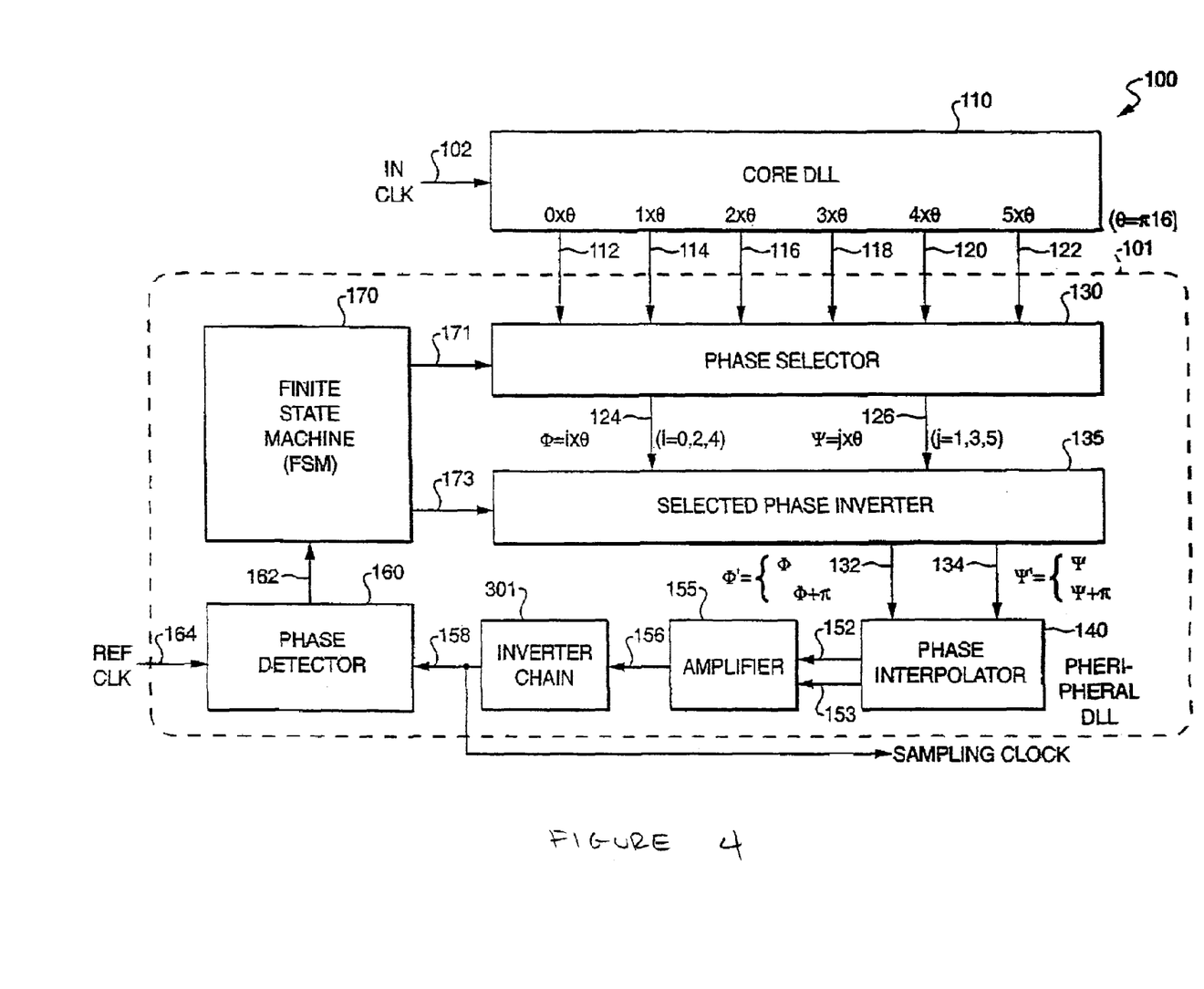
FIG. 4 shows a mixed signal DLL.

FIG. 4 shows a block diagram 100 of a mixed signal delay locked loop (DLL) architecture. This architecture is based on two cascaded loops: a conventional first-order analog core DLL 110 and a digital peripheral DLL 101. The core DLL 110 is locked at a 180 degrees phase shift. Assuming that the delay line of the core DLL 110 comprises six buffers, their outputs are six clocks having phases evenly spaced by 30 degrees. The core DLL 110 has an input of IN CLK 102 that is used to create the six delayed outputs. The first output is a zero degree phased output 112 with each subsequent output adding an additional 30 degree phase shift at phased outputs 114, 116, 118, 120, and 122, respectively.

The peripheral DLL 101 selects a pair of clocks, φ 124 and ψ 126, to interpolate between. The clocks, φ 124 and ψ 126, are selected from the six phased outputs 112, 114, 116, 118, 120, and 122 by a phase selector 130. Clocks φ 124 and ψ 126 can potentially be inverted in order to cover the full 0 degree to 360 degree phase range by a selective phase inverter 135. Clocks φ' 132 and ψ' 134 drive a digitally controlled phase interpolator 140 which generates a differential clock: main clock Θ 152 and its complement, main clock Θ_153. The phase of the main clock Θ 152 (and its complement) can be any of the N quantized phase steps between the phases of clocks φ' 132 and ψ' 134, where 0...N is the interpolation controlling word range. The main clock Θ 152 is approximately equal to φ'+(1−α/16)×(ψ'−φ') where α=(0, 1, ..., 16).

The main clock Θ 152 and main clock Θ_153 of the phase interpolator 140 drive an amplifier 155 that increases a voltage swing of the main clock Θ 152 and main clock Θ_153 to create a larger relative voltage swing at the amplifier output 156. The amplifier output 156 characteristics may follow the main clock Θ 152 characteristics with the larger relative voltage swing. The inverter chain 301 buffers the amplifier output 156. A buffer, for the purposes of this description, creates a copy of the input signal at the output that is better suited to drive a larger load (i.e., generates a rise or fall time of the output signal similar to the input signal even though the amount of resistance and/or capacitance attached to the output is greater). The inverter chain 301 buffers the amplifier output 156 and generates an inverter chain output 158 to drive a sampling clock (i.e., latching signal) of one or more receivers.

The inverter chain output 158 also drives a phase detector 160 that compares the inverter chain output 158 to a reference clock, REF CLK, 164. A phase detector output 162 is used by a finite state machine (FSM) 170 to control the phase selector 130 and the selective phase inverter 135, through FSM control lines 171 and 173, respectively. The finite state machine (FSM) 170 also controls the phase interpolator 140 mixing weight (not shown).

The FSM 170 adjusts the phase of the main clock Θ 152 and main clock Θ_153 according to the phase detector output 162. Generally, this means just changing the phase interpolator 140 mixing weight by one. If, however, the phase interpolator 140 controlling word has reached its minimum or maximum limit, the FSM 170 must change the phase of φ 124 or ψ 126 to the next appropriate selection. This phase selection change might also involve an inversion of the corresponding clock if the current interpolation interval is adjacent to the 0 degree or 180 degree boundary. As these phase selection changes happen only when the corresponding phase mixing weight is zero, no glitches occur on the output clock. The digital "bang-bang" nature of the control results in dithering around the zero phase error point in the lock condition. The dither amplitude is determined by the phase interpolator 140 and the delay through the peripheral DLL 101.

In this architecture, the main clock Θ 152 and main clock Θ_153 phase can be rotated, so no hard limits exist in the loop phase capture range: the loop provides unlimited (modulo 2π) phase shift capability. This property eliminates boundary conditions and phase relationship constraints. The only requirement is that the IN CLK 102 and REF CLK 164 are plesiochronous (i.e., their frequency difference is bounded), making this architecture suitable for clock recovery applications.

Characterizing a mixed signal DLL, such as the one shown in FIG. 4, is a very challenging task due to the fact that both analog and digital signals must be handled simultaneously. It is difficult to determine when the mixed signal DLL is locked and whether the clock phases are offset with the correct values when both analog and digital signal co-exist in a loop due to the fact that the locking mechanism is not solely dependent on the analog reference and feedback signals but is also dependent on the digital finite state machine that is used to control the loop. Although converting from digital to analog is time consuming, it is typically needed because most simulators that simulate the analog block of the loop do not understand digital signals. Moreover, running the simulation in different process corners and operating frequencies with different input signals consumes even more time.

Embodiments of the present invention relate to a technique for characterizing the behavior of a mixed signal DLL. Embodiments of the present invention further relate to a computer system that uses a characterization engine to test and simulate a mixed signal DLL. Embodiments of the present invention further relate to a software tool for characterizing a mixed signal DLL. Embodiments of the present invention further relate to a tool that determines jitter between clock phases of a mixed signal DLL. Embodiments of the present invention further relate to a tool that performs signal conversion of a mixed signal DLL.

A mixed signal DLL characterization tool in accordance with one or more embodiments of the present invention automates the characterization of two levels of a mixed signal DLL, one pertaining to the analog DLL block and the other pertaining to the digital DLL block. This mixed signal DLL characterization tool not only determines when the loop is locked and the offset between specified clock phases, it also provides the minimum and maximum cycle to cycle variation and peak to peak offset. Moreover, the mixed signal DLL characterization tool automates the characterization of the mixed signal DLL in different simulation corners. Further, the mixed signal DLL characterization tool is capable of characterizing the sub-circuits used in the mixed signal DLL to help in the understanding of sub-circuit performance and operation in a particular mixed signal DLL. The mixed signal DLL characterization tool also provides digital to analog input conversion so that a user only needs to provide binary values of the input signals, which, in turn, get converted into analog signals recognizable by a simulator.

A mixed signal DLL characterization tool in accordance with one or more embodiments of the present invention captures binary inputs from an user and generates piece-wise linear signals for a mixed signal DLL simulation tool. The characterization tool automatically takes measurements to determine characteristics of the mixed signal DLL. Moreover, the characterization tool determines whether the mixed signal DLL is in lock, and if so, whether the offset between the reference clock and the output clock is as expected.

Figure 5:
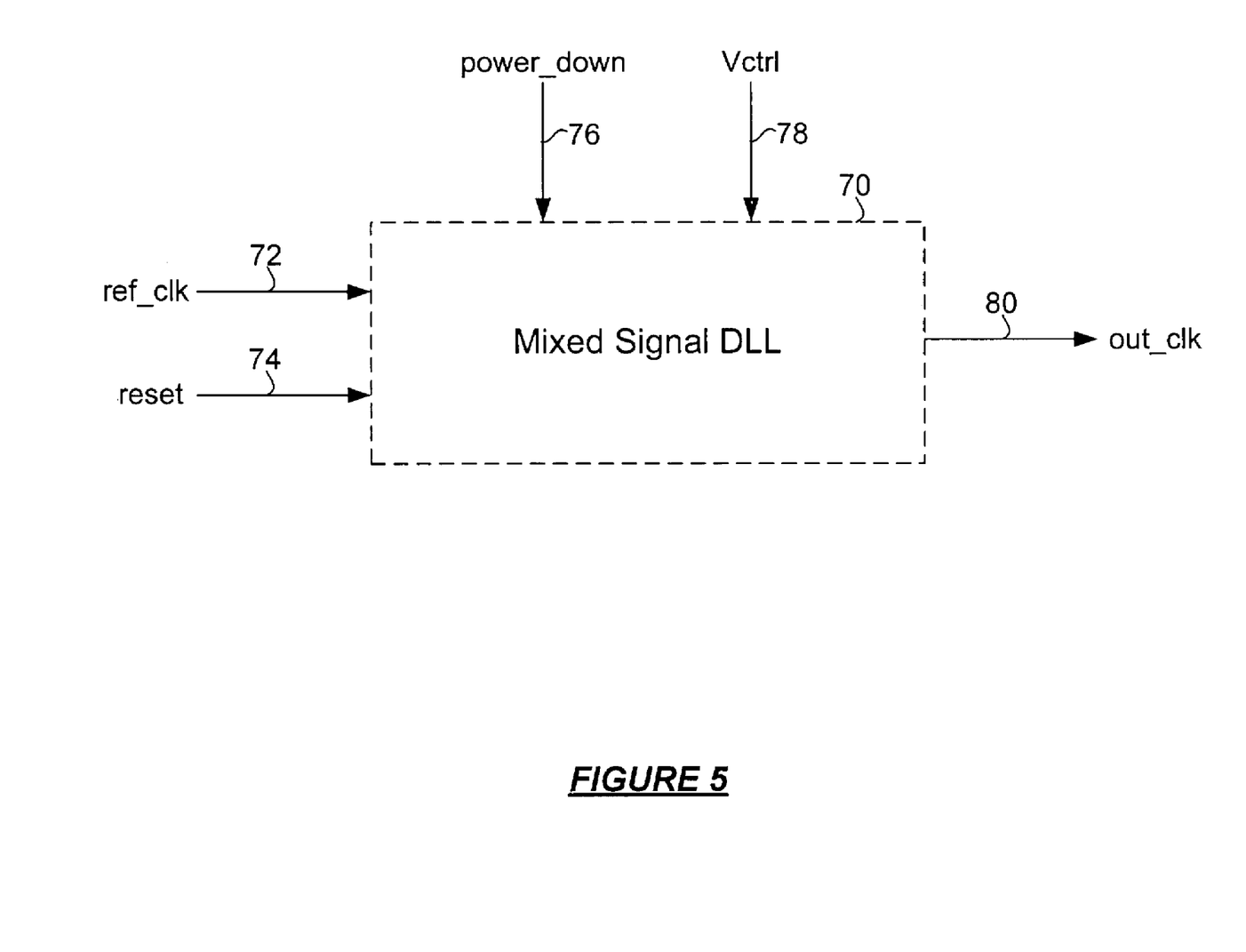
FIG. 5 shows a block diagram in accordance with an embodiment of the present invention.

FIG. 5 shows a block diagram of a mixed signal DLL 70 used to describe an embodiment of the present invention. A mixed signal DLL characterization tool selectively adjusts values of signals associated with the mixed signal DLL 70, such as an input reference clock, ref_clk 72, a reset signal, reset 74, a power down signal, power_down 76, a control voltage, Vctrl 78, and output clock, out_clk 80. The mixed signal DLL characterization tool controls the simulation of the mixed signal DLL 70 by providing various values for these signal at a wide range of process corners. The mixed signal DLL characterization tool tests the mixed signal DLL 70 exhaustively by using a top-down approach to ensure the robustness of the mixed signal DLL 70. In other words, the mixed signal DLL characterization tool initially tests the mixed signal DLL 70 from a perspective of components outside the mixed signal DLL 70 and then tests the mixed signal DLL 70 from a perspective of components inside the mixed signal DLL 70. Using this approach, the mixed signal DLL characterization tool is able to determine waveforms and other behavior of the mixed signal DLL 70 from a high-level perspective and then apply the determined waveforms to components within the mixed signal DLL 70.

The top-level testing involves one or more of the following: adjusting a phase of the reference clock 72, adjusting a frequency of the reference clock 72, adjusting a duty cycle of the reference clock 72, and adjusting relationships of differential inputs to the mixed signal DLL 70. The bottom-level testing tests the mixed signal DLL's 70 components thoroughly in order to provide detailed insight of the performance levels of the components individually.

For operation, the mixed signal DLL characterization tool inputs a circuit schematic of the mixed signal DLL 70 and a configuration file that includes a description of the inputs, outputs, and other signals of interest of the mixed signal DLL 70 as shown in FIG. 5. Using this information, the mixed signal DLL characterization tool simulates the mixed signal DLL 70 and runs transient analysis techniques to simulate the locking behavior of the mixed signal DLL 70. Results of the simulation may then be read by the mixed signal DLL characterization tool and put into a desirable format, e.g., chart, plot, table, etc.

Figure 6:
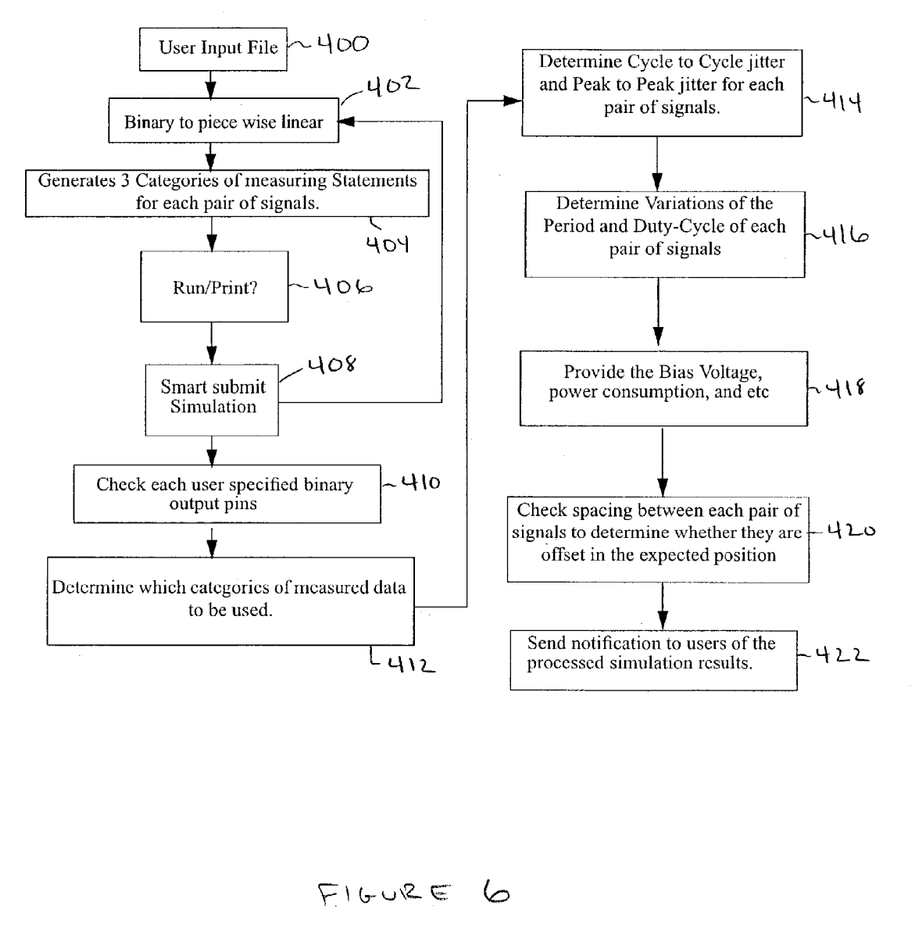
FIG. 6 shows a flow process in accordance with an embodiment of the present invention.

FIG. 6 shows an exemplary flow process of a mixed signal DLL characterization tool in accordance with an embodiment of the present invention. Particularly, FIG. 6 shows a flow process of a top-level characterization of a mixed signal DLL. After inputting data from a user file 400, the input data is converted from binary form to piece-wise linear form 402. Thereafter, three categories of measuring statements are generated for each pair or input signals to the mixed signal DLL 404. These categories are: the two input signals are offset as desired, one of the input signals leads the other input signal, and one of the input signals lags the other input signal.

Once the categories are generated 404, the flow process can be interrupted by a print command or a run command 406, which, in the case of the run command, causes the mixed signal DLL to be simulated based on the information provided by the mixed signal DLL characterization tool 408. Thereafter, the user specified binary output pins are checked 410 to determine which category of measured data should be used 412.

Based on the determination of which category to use 412, the mixed signal DLL characterization tool determines the cycle to cycle jitter and peak to peak jitter for each pair of input signals 414, variations of the period and duty cycle of each pair of input signals 416, and the bias voltage, power consumption, etc. 418. The mixed signal DLL characterization tool also checks the spacing, i.e., the offset, between each pair of signals to determine whether that are offset in the expected positions 420. Then, the mixed signal DLL characterization tool sends to the users notification information of the processed simulation results 422.

FIG. 7 shows an exemplary flow process of a mixed signal DLL characterization tool in accordance with an embodiment of the present invention. Particularly, FIG. 7 shows a flow process for characterizing the digital sub-circuits of the mixed signal DLL. Once a simulation mode at different clock frequencies and corners is determined 430, and after a binary to piece-wise linear transformation of the input data has been performed 432, a spice deck for simulation is generated 434. After the generation of the spice deck 434, a simulation of the mixed signal DLL is performed 436, the results of which are processed 438 and then printed 440.

Figure 8:
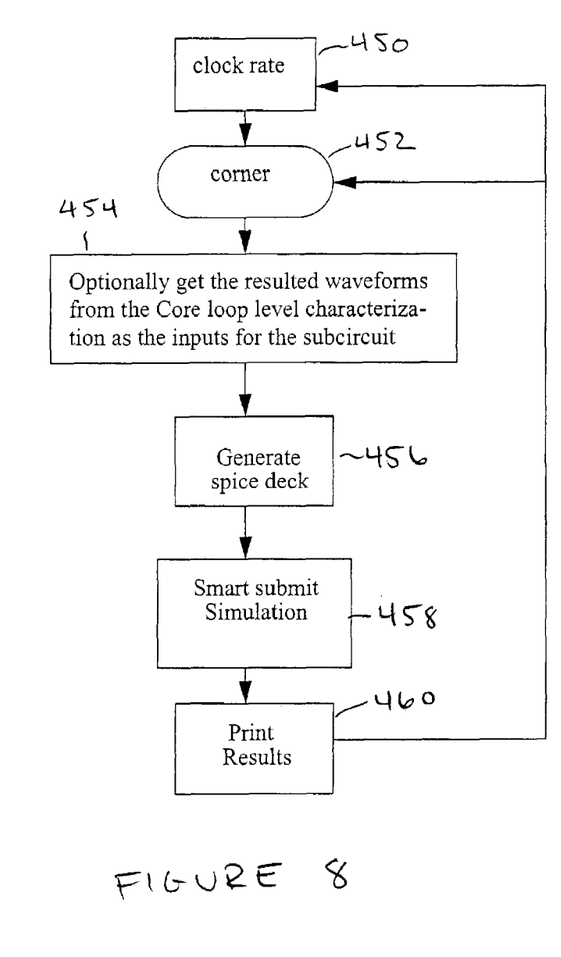
FIG. 8 shows a flow process in accordance with an embodiment of the present invention.

FIG. 8 shows an exemplary flow process of a mixed signal DLL characterization tool in accordance with an embodiment of the present invention. Particularly, FIG. 8 shows a flow process for characterizing the analog sub-circuits of the mixed signal DLL. Once a clock rate 450 and process corner 452 are determined or inputted, the mixed signal DLL characterization tool may obtain the resulting waveforms from the core loop level characterization (described with reference to FIG. 6) as the inputs for the analog sub-circuits in the mixed signal DLL 454. Thereafter, a spice deck is generated 456. After the generation of the spice deck 456, a simulation of the mixed signal DLL is performed 458, the results of which are processed and then printed 460.

Figure 9:
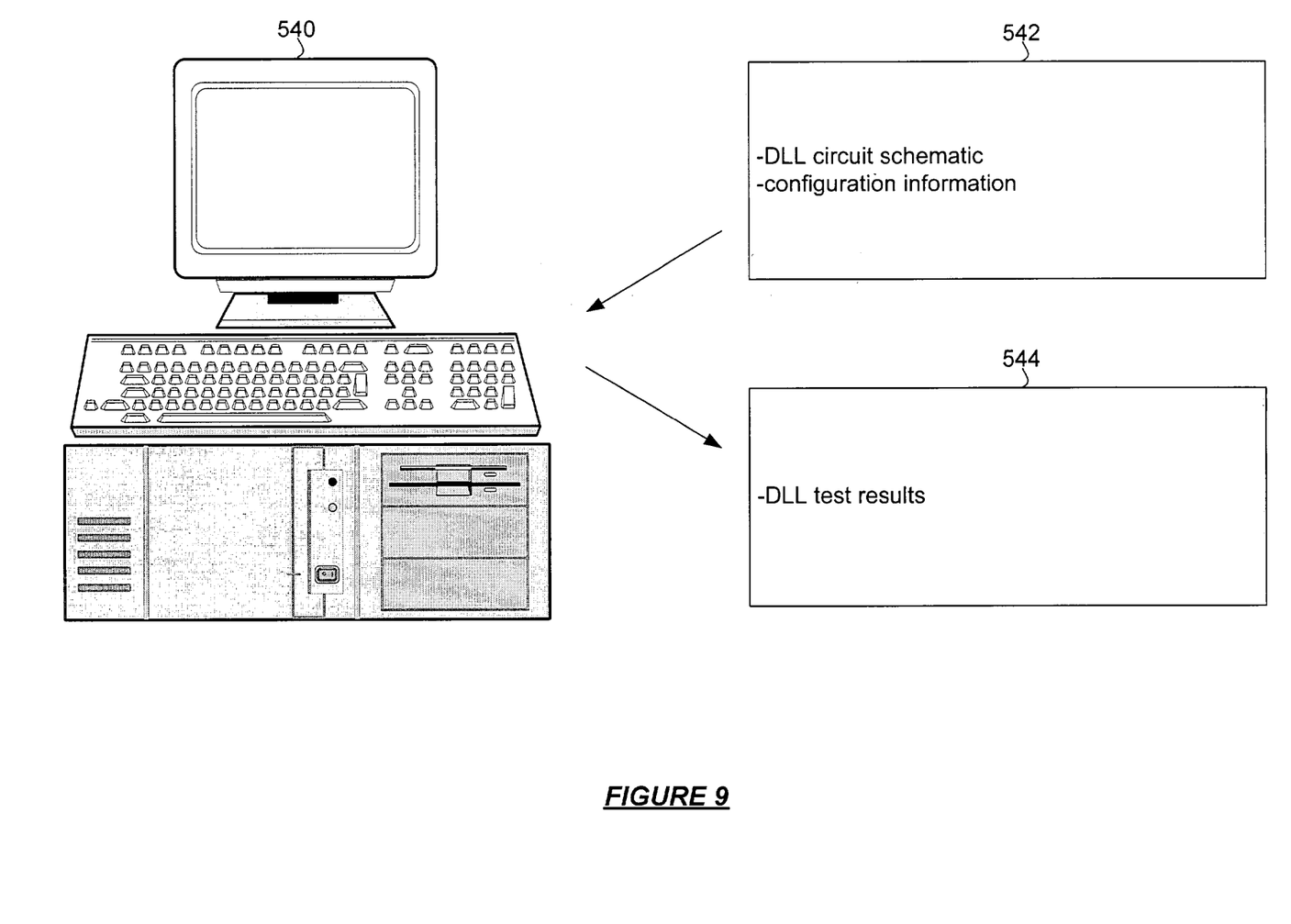
FIG. 9 shows a computer system in accordance with an embodiment of the present invention.

FIG. 9 shows an exemplary computer system 540 that automatically characterizes a mixed signal DLL in accordance with an embodiment of the present invention. Input parameters 542 provided to the computer system 540 include a circuit schematic and configuration information descriptive of particular signals associated with the mixed signal DLL. The input parameters 542 serve as input data to the computer system 540 via some computer-readable medium, e.g., network path, floppy disk, input file, keyboard, etc. The computer system 540 then permanently or temporarily stores the input parameters 542 in memory (not shown) to subsequently test (via processor functions) the mixed signal DLL in a plurality of simulation process corners in accordance with one of the various techniques discussed with reference to the present invention.

Thereafter, depending on a chip designer's request, the computer system 540 outputs mixed signal DLL test results 544 via some user-readable medium, e.g., monitor display, network path, etc., where the results 544 may include information indicating the simulated behavior of the mixed signal DLL in a plurality of process corners.

Those skilled in the art will appreciate that in other embodiments, a software program capable of characterizing a mixed signal DLL may be used. Those skilled in the art will further appreciate that embodiments of the present invention may also relate to an integrated circuit manufacturing process by which a integrated designer designs for manufacture an integrated circuit having a mixed signal DLL designed using one of the mixed signal DLL characterization techniques presented by means of describing the present invention.

Advantages of the present invention may include one or more of the following. In some embodiments, because a mixed signal DLL characterization tool is capable of testing a mixed signal DLL in a plurality of process corners and under various circumstances, subsequent mixed signal DLL performance may be improved.

In some embodiments, because a top-down approach is used to characterize a mixed signal DLL, the approach may extract resulting waveforms and use them as input waveforms for sub-circuits within the mixed signal DLL. This is advantageous because the input waveforms reflect the actual signals that are coming in from the devices that are driving it. This allows designers to have a more realistic view of the performance levels of components within the mixed signal DLL.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for characterizing a mixed signal delay locked loop, comprising:
   top-level testing the mixed signal delay locked loop to generate a waveform representative of an operation of the mixed signal delay locked loop, wherein the top-level testing involves at least one of the following:
      adjusting a phase of a reference clock, adjusting a freciuency of the reference clock, adjusting a duty cycle of the reference clock, and adjusting relationships of differential inputs to the mixed signal delay locked loop;
   bottom-level testing at least one of the digital sub-circuits in the mixed signal delay locked loop; and
   bottom-level testing at least one of the analog sub-circuits in the mixed signal delay locked loop.

2. The method of claim 1, wherein the bottom-level testing of the at least one of the analog sub circuits is dependent on the waveform.

3. The method of claim 1, further comprising binary input data to piece-wise linear data.

4. The method of claim 1, wherein the top-level testing comprises:
   inputting a circuit schematic of the mixed signal delay locked loop;
   inputting configuration information descriptive of at least one signal associated with the mixed signal delay locked loop; and
   simulating the mixed signal delay locked loop in at least one process corner using the circuit schematic and configuration information.

5. The method of claim 1, wherein the top-level testing comprises at least one selected from the group consisting adjusting a phase of an input to the mixed signal delay locked loop, adjusting a frequency of the input to the mixed signal delay locked loop, and adjusting a duty cycle of the input to the mixed signal delay locked loop.

6. The method of claim 1, wherein the top-level testing is performed at a plurality of process corners.

7. The method of claim 1, further comprising:
   analyzing the circuit by applying the waveform to an input of the mixed signal delay locked loop.

8. The method of claim 1, wherein the top-level testing comprises:
   applying a test value to one selected from the group consisting a reference clock input to the mixed signal delay locked loop, a reset signal to the mixed signal delay locked loop, a control voltage of the mixed signal delay locked loop, a power signal to the mixed signal delay locked loop, and an output clock of the mixed signal delay locked loop; and
   storing the waveform, wherein the waveform is determined based on the applying.

9. A computer-readable medium having recorded therein instructions executable by processing the instructions for:
   top-level testing a mixed signal delay locked loop to generate a waveform representative of an operation of the mixed signal delay locked loop, wherein the top-level testing involves at least one of the following:
      adjusting a phase of a reference clock, adjusting a frequency of the reference clock, adjusting a duty cycle of the reference clock, and adjusting relationships of differential inputs to the mixed signal delayed locked loop;
   bottom-level testing at least one of the digital sub-circuits in the mixed signal delay locked loop; and
   bottom-level testing at least one of the analog sub-circuits in the mixed signal delay locked loop.

10. The computer-readable medium of claim 9, further comprising instructions for transforming binary input data to piece-wise linear input data.

11. The computer-readable medium of claim 9, wherein the instructions for the bottom-level testing of the at least one of the analog sub-circuits are dependent on the waveform.

12. The computer-readable medium of claim 9, wherein the instructions for the top-level testing comprise instructions for at least one selected from the group consisting adjusting a phase of an input to the mixed signal delay locked loop, adjusting a frequency of the input to the mixed signal delay locked loop, and adjusting a duty cycle of the input to the mixed signal delay locked loop.

13. The computer-readable medium of claim 9, wherein the top-level testing is performed at a plurality of process corners.

14. The computer-readable medium of claim 9, wherein the instructions for the top-level testing comprise instructions for:
   applying a test value to one selected from the group consisting a reference clock input to the mixed signal delay locked loop, a reset signal to the mixed signal delay locked loop, a control voltage of the mixed signal delay locked loop, a power signal to the mixed signal delay locked loop, and an output clock of the mixed signal delay locked loop; and
   storing the waveform, wherein the waveform is determined based on the applying.

15. A computer system, comprising:
   a processor;
   a memory; and
   instructions, residing in the memory and executable by the processor, for top-level testing a mixed signal delay locked loop to generate a waveform representative of an operation of the mixed signal delay locked loop, wherein the top-level testing involves adjusting a phase of a reference clock, adjusting a freciuency of the reference clock, adjusting a duty cycle of the reference clock, and adjusting relationships of differential inputs to the mixed signal delay locked loop, bottom-level testing at least one of the digital sub-circuits in the mixed signal delay locked loop, and bottom-level testing at least one of the analog sub-circuits in the mixed signal delay locked loop.

16. The computer system of claim 15, further comprising instructions for:

applying a test value to one selected from the group consisting a reference clock input to the mixed signal delay locked loop, a reset signal to the mixed signal delay locked loop, a control voltage of the mixed signal delay locked loop, a power signal to the mixed signal delay locked loop, and an output clock of the mixed signal delay locked loop; and storing the waveform, wherein the waveform is determined based on the applying.

17. The computer system of claim 15, further comprising instructions transforming binary input data to piece-wise linear input data.

* * * * *